United States Patent [19]
Farrell et al.

[11] Patent Number: 6,114,840
[45] Date of Patent: Sep. 5, 2000

[54] SIGNAL TRANSFER DEVICES HAVING SELF-TIMED BOOSTER CIRCUITS THEREIN

[75] Inventors: Michael Francis Farrell, Atlanta; Paul Edwin Platt, Duluth, both of Ga.

[73] Assignee: Integrated Device Technology, Inc., Santa Clara, Calif.

[21] Appl. No.: 09/154,995

[22] Filed: Sep. 17, 1998

[51] Int. Cl.[7] .................................................. H03K 17/04
[52] U.S. Cl. .................... 322/374; 327/112; 327/437; 327/108; 327/379; 326/17; 326/86
[58] Field of Search .................................. 327/379, 437, 327/390, 108, 589, 112, 544, 263, 374, 376, 377; 326/86, 17

[56] References Cited

U.S. PATENT DOCUMENTS

| | | | |
|---|---|---|---|
| 3,832,489 | 8/1974 | Krishna | 178/71 R |
| 4,395,710 | 7/1983 | Einolf, Jr. et al. | 340/825.5 |
| 5,265,123 | 11/1993 | Vijeh et al. | 375/3 |
| 5,430,726 | 7/1995 | Moorwood et al. | 370/85.11 |
| 5,430,762 | 7/1995 | Vijeh et al. | 375/211 |
| 5,455,521 | 10/1995 | Dobbelaere | 326/86 |
| 5,613,077 | 3/1997 | Leung et al. | 395/306 |
| 5,621,899 | 4/1997 | Gafford et al. | 395/299 |
| 5,648,984 | 7/1997 | Kroninger et al. | 375/211 |
| 5,684,966 | 11/1997 | Gafford et al. | 395/309 |

*Primary Examiner*—Dinh T. Le
*Attorney, Agent, or Firm*—Myers Bigel Sibley & Sajovec

[57] ABSTRACT

Signal transfer devices enable multiple processors to act as drivers or receivers of signals which can transition from an invalid state to a valid state and then return to the invalid state in one clock cycle. The preferred signal transfer device includes a bus line, a plurality of bus drivers electrically connected to the bus line for initiating wired-OR signal transitions and at least one self-timed booster circuit electrically connected to the bus line. The self-timed booster circuit includes a first field effect transistor electrically connected in series between the bus line and a first reference potential and a second field effect transistor electrically connected in series between the bus line and a second reference potential. A timing circuit is also provided as a plurality of inverters which are electrically coupled in series. The timing circuit, which has an input electrically coupled to the bus line, performs a boolean inversion of the signals on the bus line after a first delay. A circuit is also provided for turning on the first and second field effect transistors during consecutive time intervals which are preferably non-overlapping to thereby reduce power consumption. Here, the circuit may comprise a multi-input NOR gate having a first input electrically connected to the output of the timing circuit, a second input electrically connected to the bus line and an output electrically connected to a gate electrode of the first field effect transistor. This circuit may also comprise an inverter having an input electrically connected to the output of the timing circuit and an output electrically connected to a gate electrode of the second field effect transistor.

16 Claims, 2 Drawing Sheets

SIGNAL TRANSFER DEVICES HAVING SELF-TIMED BOOSTER CIRCUITS THEREIN

FIELD OF THE INVENTION

The present invention relates to integrated circuit devices, and more particularly to devices for driving bus lines on integrated circuit substrates.

BACKGROUND OF THE INVENTION

Traditional wired-OR signal transfer devices have been created using a static approach by incorporating resistors to pull-up (or pull-down) a bus line to an invalid state. However, when the bus line is pulled to a valid state, relatively high levels of current may be wasted because the competing pull-up resistors and pull-down transistors may provide a low resistance path between power supply potentials (e.g., Vdd and Vss). This wasted current can be reduced by increasing the resistance of the pull-up resistors, however, such an increase will typically result in a reduction in pull-up speed.

Dynamic wired-OR signal transfer devices have also been used and these devices typically use a clock signal to precharge a bus line. The precharge devices are then turned off and the logic is enabled. This dynamic approach may save power compared to the static approach, however, the total time for an individual transition (pull-up or pull-down) may only be half of a clock cycle. For long and heavily capacitive lines, half a clock cycle may not provide a sufficient amount of time for adequate pull-up or pull-down. Asynchronously timed signal transfer devices have also been used, however, such circuits may require that pull-up and pull-down transistors be simultaneously conductive which can lead to excessive power consumption.

Thus, notwithstanding the above-described wired-OR signal transfer devices, there continues to be a need for improved and highly reliable and efficient signal transfer devices which have excellent pull-up and/or pull-down capability and reduced power consumption requirements.

SUMMARY OF THE INVENTION

It is therefore an object of the present invention to provide improved signal transfer devices.

It is another object of the present invention to provide signal transfer devices having improved booster circuits therein.

It is still another object of the present invention to provide wired-OR signal transfer devices having reduced power consumption requirements.

It is yet another object of the present invention to provide booster circuits which can handle fast wired-OR signal line transitions.

These and other objects, advantages and features of the present invention are provided by preferred signal transfer devices which enable multiple processors to act as drivers or receivers of signals which transition from an invalid state to a valid state and then return to the invalid state in one clock cycle. According to one embodiment of the present invention, a preferred wired-OR signal transfer device includes a bus line, a plurality of bus drivers electrically connected to the bus line for initiating wired-OR signal transitions and at least one self-timed booster circuit electrically connected to the bus line. According to a preferred aspect of the present invention, the self-timed booster circuit includes a first field effect transistor (e.g., NMOS pull-down transistor) electrically connected in series between the bus line and a first reference potential (e.g., Vss) and a second field effect transistor (e.g., PMOS pull-up transistor) electrically connected in series between the bus line and a second reference potential (e.g., Vdd). A timing circuit is also provided as a plurality of inverters which are electrically coupled in series. The timing circuit, which has an input electrically coupled to the bus line, performs a boolean inversion of the signals on the bus line after a first delay.

Means is also provided for turning on the first and second field effect transistors during consecutive time intervals which are preferably nonoverlapping to thereby reduce power consumption. Here, the preferred means for turning on the first and second field effect transistors may comprise a multi-input NOR gate having a first input electrically connected to the output of the timing circuit, a second input electrically connected to the bus line and an output electrically connected to a gate electrode of the first field effect transistor. This means may also comprise an inverter having an input electrically connected to the output of the timing circuit and an output electrically connected to a gate electrode of the second field effect transistor. In addition, third and fourth field effect transistors (PMOS pull-up transistors) may be provided. The third field effect transistor is electrically connected in series between the signal line and the second reference potential and has a gate electrode electrically connected to the first reference potential so that a normally-on conductive state can be sustained. The width of the third field effect transistor is also preferably less than the width of the second field effect transistor so that a relatively weak pull-up function can be performed continuously on the bus line. In contrast, the fourth field effect transistor may be provided as a power-on reset transistor to insure that the bus line always powers up in an invalid state. This fourth field effect transistor may be electrically connected in series between the bus line and the second reference potential and have a gate electrode electrically connected to a reset signal line.

Based on this configuration of devices in the self-timed booster circuit, the first field effect transistor may be turned on during a pull-down time interval having a duration equal to the first delay and then, upon termination of the pull-down time interval, the second field effect transistor may be automatically turned on during a pull-up time interval which also has a duration equal to the first delay. Thus, reduced power consumption requirements can be achieved by limiting competition between the pull-up and pull-down transistors at the end of the pull-down time interval. Alternatively, for bidirectional signal transfer devices, the inverter and the third and fourth transistors may be replaced by a multi-input NAND gate having a first input electrically connected to the output of the timing circuit, a second input electrically connected to the bus line and an output electrically connected to a gate electrode of the second field effect transistor.

According to still another preferred aspect of the present invention, the bus driver includes, among other things, an inverting delay circuit, a two-input NOR gate having a first input electrically connected to an input of the inverting delay circuit and a second input electrically connected to an output of the inverting delay circuit, and an NMOS pull-down transistor electrically connected in series between the bus line and the first reference potential. This NMOS pull-down transistor also has a gate electrode electrically coupled to an output of the two-input NOR gate, so that an invalid to valid to invalid transition can be initiated on the bus line.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
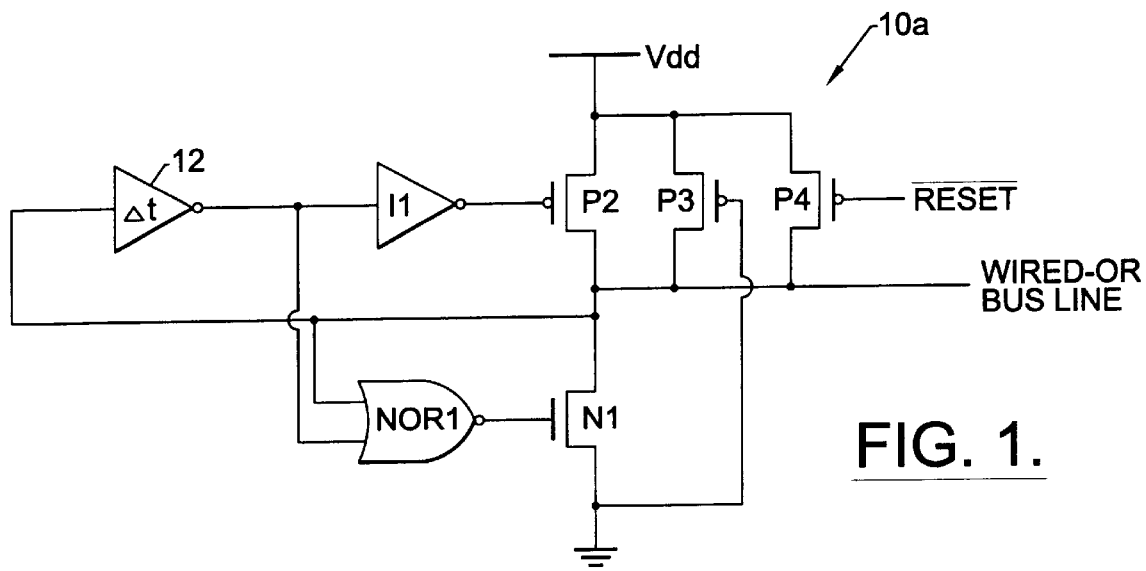
FIG. 1 is an electrical schematic of a self-timed booster circuit according to a first embodiment of the present invention.

Referring now to FIG. 1, a self-timed booster circuit 10a according to a first embodiment of the present invention will be described. This booster circuit 10a acts as a signal repeater and includes a first NMOS field effect transistor N1 electrically connected in series between a bus line (e.g., wired-OR bus) and a first reference potential (e.g., Vss, Gnd) and a second PMOS field effect transistor P2 electrically connected in series between the bus line and a second reference potential (e.g., Vdd). A timing circuit 12 may also be provided as a plurality of inverters which are electrically coupled in series to provide a desired delay. The timing circuit 12, which has an input electrically coupled to the bus line, performs a boolean inversion of the signals on the bus line after a first delay ($\Delta t$).

Means is also provided for turning on the first and second field effect transistors N1 and P2 during consecutive time intervals. These time intervals are preferably nonoverlapping to thereby reduce power consumption. Here, the preferred means for turning on the first and second field effect transistors N1 and P2 may comprise a multi-input NOR gate NOR1 having a first input electrically connected to the output of the timing circuit 12, a second input electrically connected to the bus line and an output electrically connected to a gate electrode of the first field effect transistor N1. This means may also comprise an inverter I1 having an input electrically connected to the output of the timing circuit 12 and an output electrically connected to a gate electrode of the second field effect transistor P2.

In addition, third and fourth PMOS field effect transistors P3 and P4 may be provided. The third field effect transistor P3 is electrically connected in series between the signal line and the second reference potential. The third field effect transistor P3 also has a gate electrode electrically connected to the first reference potential so that a normally-on conductive state can be sustained. This normally-on conductive state enhances noise immunity when the bus line is set to an invalid state. The width of the third field effect transistor P3 is also preferably less than a width of the second field effect transistor P2 so that a relatively weak pull-up function can be performed continuously on the bus line. In contrast, the fourth field effect transistor P4 may be provided as a power-on reset transistor to insure that the bus line always powers up in a known state (e.g., an invalid state). This fourth field effect transistor P4 may be electrically connected in series between the bus line and the second reference potential and have a gate electrode electrically connected to a reset signal line ($\overline{\text{RESET}}$). Based on this configuration of devices in the self-timed booster circuit 10a, the first field effect transistor N1 may be turned on during a pull-down time interval having a duration equal to the first delay ($\Delta t$) and then, upon termination of the pull-down time interval, the second field effect transistor P2 may be automatically turned on during a pull-up time interval which also has a duration equal to the first delay ($\Delta t$).

Figure 2:
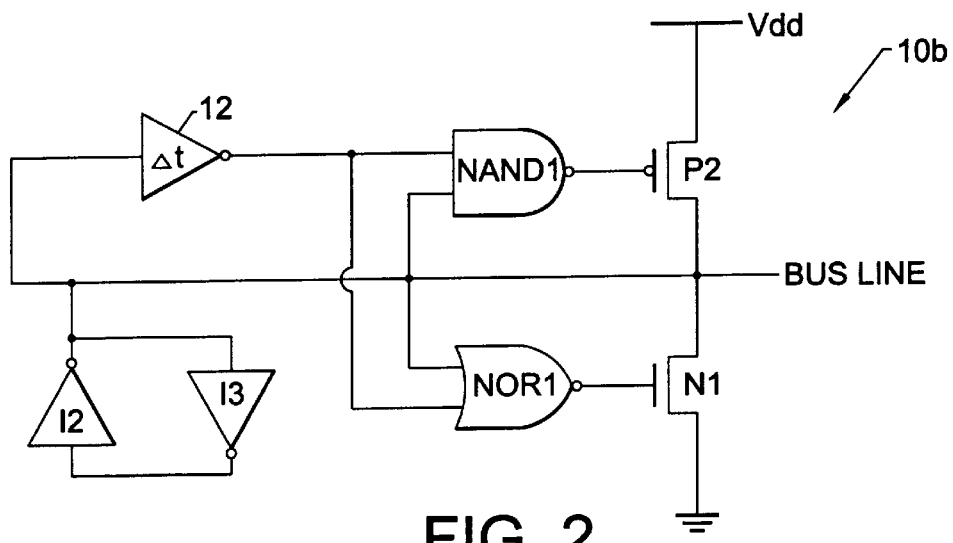
FIG. 2 is an electrical schematic of a self-timed booster circuit according to a second embodiment of the present invention.

Alternatively and as best illustrated by FIG. 2, a self-timed booster circuit 10b may also be provided for bidirectional signal transfer applications. Here, the inverter I1 and the third and fourth transistors P3 and P4 of FIG. 1 may be replaced by a multi-input NAND gate NAND1 having a first input electrically connected to the output of the timing circuit 12, a second input electrically connected to the bus line and an output electrically connected to a gate electrode of the second PMOS field effect transistor P2. A bus hold circuit comprising two inverters I2 and I3 may also be provided. As illustrated, these inverters I2 and I3 are preferably connected in antiparallel.

Operation of the unidirectional and bidirectional self-timed booster circuits 10a and 10b of FIGS. 1 and 2, respectively, will now be described in more detail. In particular, the fourth field effect transistor P4 of FIG. 1 performs the function of a power-on reset transistor which insures that the bus line always powers up in an invalid state (e.g., logic 1 state). This function can be achieved by applying a logic 0 signal to the $\overline{\text{RESET}}$ signal line at the commencement of operation. The initiation of a transition of the illustrated wired-OR bus line from an invalid state (e.g., logic 1 state) to a valid state (e.g., logic 0 state) by a bus driver will cause the output of the multi-input NOR gate NOR1 to transition from 0→1. This transition will then cause the NMOS pull-down transistor N1 to turn on and actively pull-down the wired-OR bus line to a valid state. However, after a brief delay ($\Delta t$), the timing circuit 12 will output a logic 1 potential and this potential will cause NMOS pull-down transistor N1 to turn off as the output of the NOR gate NOR1 transitions from 1→0. The PMOS pull-up transistor P2 will also turn on as the output of inverter I1 transitions from 1→0. Thus, after a self-timed delay of ($\Delta t$), the wired-OR bus line will be pulled back to an invalid state. Here, the width "W" of the PMOS pull-up transistor P3 is also preferably substantially less than a width of the PMOS pull-up transistor P2 (e.g., $W_{P3} \sim 0.05\ W_{P2}$) so that a relatively weak pull-up function can be performed continuously on the bus line.

Referring now to the bidirectional self-timed booster circuit 10b of FIG. 2, the initiation of a transition of the illustrated bus line from a first state (e.g., logic 1 state) to a second state (e.g., logic 0 state) by a bus driver will cause the output of the multi-input NOR gate NOR1 to transition from 0→1. This transition will then cause the NMOS pull-down transistor N1 to turn on and actively pull-down the bus line to the second state. However, after a brief delay ($\Delta t$), the timing circuit 12 will output a logic 1 potential and this potential will cause NMOS pull-down transistor N1 to turn off as the output of the NOR gate NOR1 transitions from 1→0. The bus hold circuit formed by the second and third inverters I2 and I3 may also act to hold the bus line at a logic 0 potential. Thereafter, the initiation of a transition of the illustrated bus line from 0→1 by a bus driver will cause the output of the multi-input NAND gate NAND1 to transition from 1→0. This transition will then cause the PMOS pull-up transistor P2 to turn on and actively pull-up the bus line to the first state. However, after a brief delay ($\Delta t$), the timing circuit 12 will output a logic 0 potential and this potential will cause the PMOS pull-up transistor P2 to turn off as the output of the NAND gate NAND1 transitions from 0→1. The bus hold circuit formed by the second and third inverters I2 and I3 will then act again to hold the bus line at a logic 1 potential.

Figure 3:
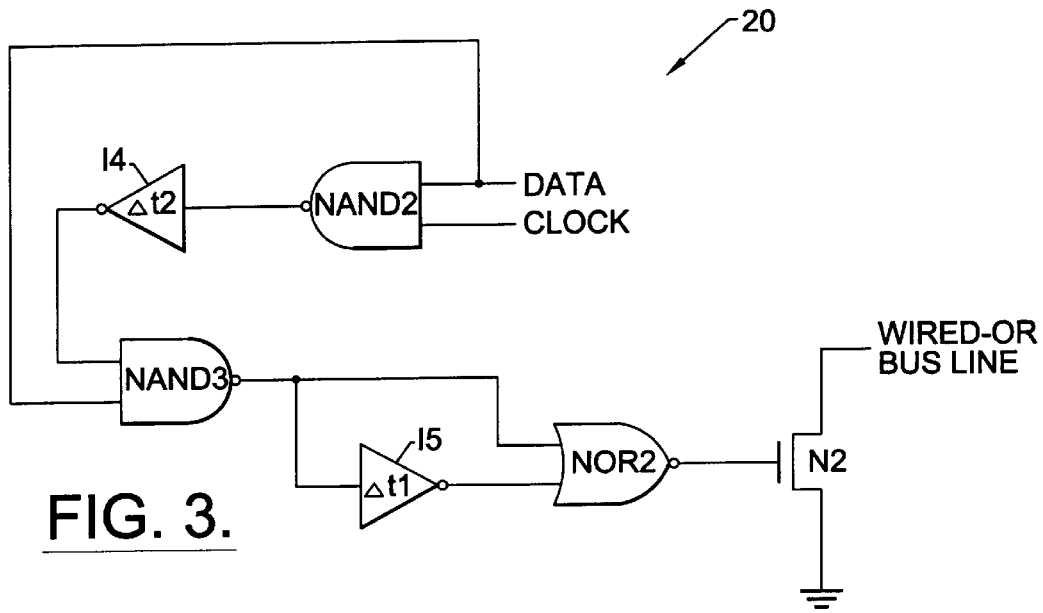
FIG. 3 is an electrical schematic of a bus driver according to a preferred aspect of the present invention.
Figure 4:
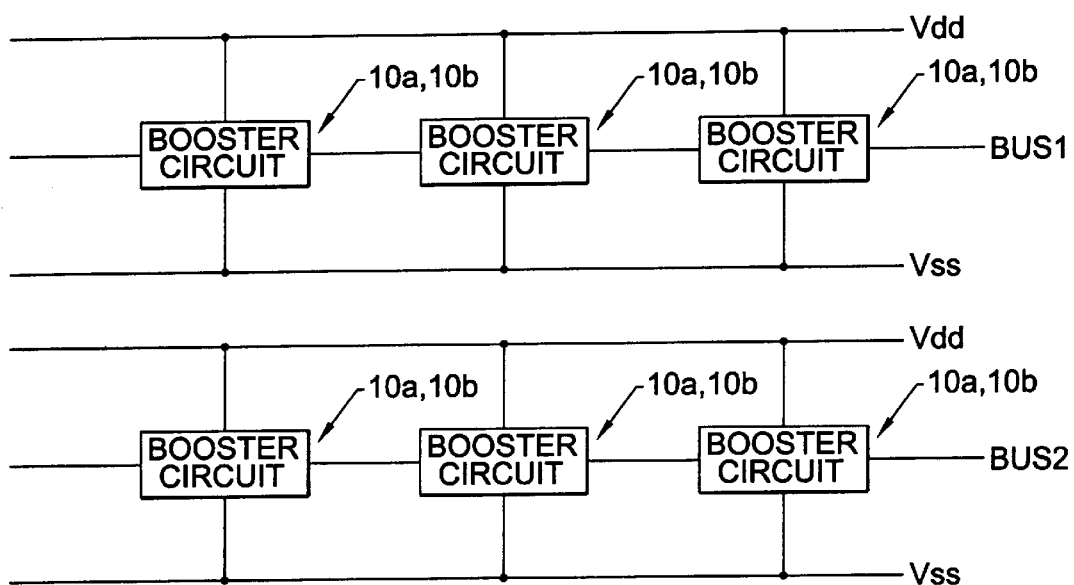
FIG. 4 is a block layout view of a preferred arrangement of power and bus signal lines according to the present invention.

Referring now to FIG. 3, a preferred bus line driver 20 will be described. As will be understood by those skilled in the art, a plurality of such drivers 20 can be connected at spaced locations along a bus line in a bus communication system and a plurality of the self-timed booster circuits 10a and 10b of FIGS. 1 and 2 may also be connected along the bus line to boost signals transmitted thereon, as illustrated by FIG. 4. The bus line driver 20 includes an inverting delay circuit I5 (having a delay $\Delta t1$), a two-input NOR gate NOR2 having a first input electrically connected to an input of the inverting delay circuit I5 and a second input electrically connected to an output of the inverting delay circuit I5, as illustrated. Second and third NAND gates NAND2 and NAND3 and another inverting delay circuit I4 (having a delay $\Delta t2$) are also provided for driving the inputs of the two-input NOR gate NOR2 in response to a data signal (DATA) and a clock signal (CLOCK). According to a preferred aspect of the present invention, the delays $\Delta t$ and $\Delta t1$ are designed to satisfy the following relationship:

$$½T \geq \Delta t1 \geq \Delta t,$$

where "T" is the period of the clock signal. In addition, if the data signal is provided as a data pulse having a pulse duration equal to "$T_p$", then the following preferred relationships should exist:

$$T_p \geq \Delta t1$$

and $$T \geq T_p + \Delta t1.$$

An NMOS pull-down transistor N2 is also electrically connected in series between the bus line and the first reference potential (e.g., Vss, GND). This NMOS pull-down transistor N2 has a gate electrode electrically coupled to the output of the NOR gate NOR2, so that an invalid→valid→invalid pulse can be initiated on the bus line and then repeated by the plurality of self-timed booster circuits 10a, 10b of FIGS. 1 and 2. The duration of this pulse is a function of the delay ($\Delta t$ and $\Delta t1$) provided by the inverting delay circuit I5.

Referring now to FIG. 4, the impact of capacitively coupled noise on each bus line can be reduced by surrounding each side of a bus line by Vdd and Vss reference potential signal lines, as illustrated. The reference potential signal lines act to decouple each bus line in a bus from adjacent bus lines. In addition, the plurality of self-timed booster circuits 10a or 10b associated with each bus line are preferably powered by the reference potential signal lines which extend on opposite sides of the bus line. Thus, any capacitive coupling to a bus line can also be coupled to the Vdd and Vss reference potential signal lines which are closest to the bus line. As determined by the inventors herein, such capacitive coupling can be used advantageously to cancel changes in the threshold voltages of the transistors in the booster circuits and inhibit the likelihood that a booster circuit will trigger incorrectly when noise is present on a bus line.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A self-timed booster circuit, comprising:
   a first field effect transistor electrically connected in series between a signal line and a first reference potential;
   a second field effect transistor electrically connected in series between the signal line and a second reference potential;
   an inverting delay device having an input electrically coupled to the signal line:
   a multi-input NOR gate having a first input electrically connected to an output of said inverting delay device, a second input electrically connected to the signal line and an output electrically connected to a gate electrode of said first field effect transistor; and
   an inverter having an input electrically connected to the output of said inverting delay device and an output electrically connected to a gate electrode of said second field effect transistor.

2. The booster circuit of claim 1, wherein said first and second field effect transistors comprise NMOS and PMOS transistors, respectively.

3. The booster circuit of claim 2, further comprising a third field effect transistor electrically connected in series between the signal line and the second reference potential and having a gate electrode electrically connected to the first reference potential.

4. The booster circuit of claim 3, wherein said third field effect transistor comprises a PMOS transistor; and wherein a width of said third field effect transistor is less than a width of said second field effect transistor.

5. The booster circuit of claim 3, further comprising a fourth field effect transistor electrically connected in series between the signal line and the second reference potential and having a gate electrode electrically connected to a reset signal line.

6. The booster circuit of claim 5, wherein said fourth field effect transistor comprises a PMOS transistor.

7. A signal transfer device, comprising:
   a signal line;
   a bus driver electrically connected to said signal line; and
   a self-timed booster circuit electrically connected to said signal line, said self-timed booster circuit comprising:
   a first field effect transistor electrically connected in series between said signal line and a first reference potential;
   a second field effect transistor electrically connected in series between said signal line and a second reference potential;
   an inverting delay device having an input electrically coupled to said signal line;
   a multi-input NOR gate having a first input electrically connected to an output of said inverting delay device, a second input electrically connected to said signal line and an output electrically connected to a gate electrode of said first field effect transistor; and
   an inverter having an input electrically connected to the output of said inverting delay device and an output electrically connected to a gate electrode of said second field effect transistor.

8. The signal transfer device of claim 7, wherein said first and second field effect transistors comprise NMOS and PMOS transistors, respectively.

9. The signal transfer device of claim 8, further comprising a third field effect transistor electrically connected in series between said signal line and the second reference potential and having a gate electrode electrically connected to the first reference potential.

10. The signal transfer device of claim 9, wherein said third field effect transistor comprises a PMOS transistor; and wherein a width of said third field effect transistor is less than a width of said second field effect transistor.

11. The signal transfer device of claim 9, further comprising a fourth field effect transistor electrically connected in series between said signal line and the second reference potential and having a gate electrode electrically connected to a reset signal line.

12. The signal transfer device of claim 7, wherein said bus driver comprises:

an inverting delay circuit;

a two-input NOR gate having a first input electrically connected to an input of said inverting delay circuit and a second input electrically connected to an output of said inverting delay circuit; and an NMOS pull-down transistor electrically connected in series between said signal line and the first reference potential and having a gate electrode electrically coupled to an output of said two-input NOR gate.

13. An integrated circuit, comprising:

a plurality of signal lines;

a plurality of first reference potential signal lines;

a plurality of second reference potential signal lines; and first and second pluralities of self-timed booster circuits electrically connected to first and second signal lines in said plurality thereof, respectively;

wherein a first one of said plurality of first reference potential signal lines and a first one of said plurality of second reference potential signal lines are disposed on opposite sides of the first signal line; and wherein a second one of said plurality of first reference potential signal lines and a second one of said plurality of second reference potential signal lines are disposed on opposite sides of the second signal line;

wherein the second one of said plurality of second reference potential signal lines extends between the first one of said plurality of first reference potential signal lines and the second signal line; and wherein at least one of said first plurality of self-timed booster circuits comprises:

a first field effect transistor electrically connected in series between the first signal line and the first one of said plurality of first reference potential signal lines;

a second field effect transistor electrically connected in series between the first signal line and the first one of said plurality of second reference potential signal lines;

an inverting delay device having an input electrically coupled to the first signal line;

a multi-input NOR gate having a first input electrically connected to an output of said inverting delay device, a second input electrically connected to the first signal line and an output electrically connected to a gate electrode of said first field effect transistor; and an inverter having an input electrically connected to the output of said inverting delay device and an output electrically connected to a gate electrode of said second field effect transistor.

14. A method of repeating a signal transition on a wired-OR signal line, comprising the steps of:

sensing a transition of a first signal on the wired-OR signal line from a first logic state to a second logic state;

pulling the wired-OR signal line to the second logic state during a first time interval having a duration measured by an inverting delay device, in response to the sensed transition; and automatically pulling the wired-OR signal line from the second logic state to the first logic state upon termination of the first time interval, in response to a transition of a second signal at the output of the inverting delay device from one logic state to another logic state.

15. The method of claim 14, wherein said automatically pulling step comprises automatically pulling the wired-OR signal line from the second logic state to the first logic state, in response to a transition of the second signal from the second logic state to the first logic state.

16. The method of claim 14, wherein said sensing step comprises sensing a transition of the first signal from a logic 1 state to a logic 0 state.

* * * * *